United States Patent
Lee

(10) Patent No.: US 7,312,116 B2
(45) Date of Patent: Dec. 25, 2007

(54) METHOD FOR FORMING A MIM CAPACITOR IN A SEMICONDUCTOR DEVICE

(75) Inventor: Joo-Hyun Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 170 days.

(21) Appl. No.: 11/316,631

(22) Filed: Dec. 20, 2005

(65) Prior Publication Data

US 2006/0141735 A1    Jun. 29, 2006

(30) Foreign Application Priority Data

Dec. 23, 2004   (KR) ...................... 10-2004-0111047

(51) Int. Cl.
*H01L 21/8242* (2006.01)

(52) U.S. Cl. ...................... 438/250; 438/253; 438/393; 257/E27.048

(58) Field of Classification Search .................... 438/3, 438/238–241, 250–256, 381, 393–399; 257/E27.048
See application file for complete search history.

(56) References Cited

U.S. PATENT DOCUMENTS 5,686,329 A * 11/1997 Chang et al. ................ 438/253

* cited by examiner

*Primary Examiner*—H. Jey Tsai
(74) *Attorney, Agent, or Firm*—Andrew D. Fortney

(57) ABSTRACT

In a method of forming a metal-insulator-metal (MIM) capacitor in a semiconductor device, after forming a capacitor insulation layer on a lower metal layer of the MIM capacitor, an upper electrode is formed by ion implantation into the capacitor insulation layer and silicidation, without a typical reactive ion etching process. Consequently, damage to the capacitor insulation layer can be minimized, and the area of the capacitor need not increase.

7 Claims, 5 Drawing Sheets

METHOD FOR FORMING A MIM CAPACITOR IN A SEMICONDUCTOR DEVICE

CROSS-REFERENCE TO RELATED APPLICATION

This application claims priority to and the benefit of Korean Patent Application No. 10-2004-0111047, filed in the Korean Intellectual Property Office on Dec. 23, 2004, the entire contents of which are incorporated herein by reference.

BACKGROUND OF THE INVENTION (a) Field of the Invention

The present invention relates to a method of manufacturing a semiconductor device. More particularly, the present invention relates to a method of forming a metal-insulator-metal (MIM) capacitor in a semiconductor device.

(b) Description of the Related Art

A logic circuit in a semiconductor device generally demands high speed operation, so research has been undertaken to develop a capacitor having a large capacitance. When the capacitor has a polysilicon-insulator-polysilicon (PIP) structure, a conductive polysilicon is used for both upper and lower electrodes. At this time, a natural oxide layer may be easily formed by oxidation at an interface between the upper and lower electrodes and an insulator layer, and therefore, a PIP capacitor has a drawback in that total capacitance thereof may be reduced.

In order to overcome such a drawback, the capacitor structure can be changed to a metal-insulator-metal (MIM) capacitor structure. The MIM capacitor has low resistivity and no parasitic capacitance caused by depletion, so it is widely used in high performance semiconductor devices benefiting from a high Q value.

FIG. 1 is a cross-sectional view showing a semiconductor device having a general MIM capacitor. FIG. 2 is a cross-sectional view of a MIM capacitor having a capacitor spacer for preventing damage to a capacitor insulation layer.

In more detail, FIG. 1 shows a semiconductor device having an MIM capacitor. A capacitor insulation layer 12 (capacitor dielectric layer) and an upper conductor layer 14 (capacitor top electrode) are formed on a lower metal layer 10 (capacitor bottom electrode). In FIG. 1, reference numerals 50a and 50b indicate overlying metal line layers, and reference numerals 60a and 60b indicate via contacts between metal layers. In addition, reference numerals 16 and 18 indicate insulating material layers. In FIG. 1, bulk interlayer insulator layers (between metal layers) are omitted for convenience of description.

When the upper conductor layer 14, for example a titanium nitride layer, is etched, a partial loss of the capacitor insulation layer 12 may occur, particularly when the capacitor insulation layer 12 comprises a nitride layer such as silicon nitride. This loss may be due to insufficient etch selectivity between the upper conductor layer 14 and the capacitor insulation layer 12, and may cause an undesired increase in capacitor leakage current.

In order to decrease the capacitor leakage current (or reduce or offset any increase in capacitor leakage current), a thickness of the capacitor insulation layer 12 (which is generally capable of preventing diffusion from a copper line layer) should be increased, or a process margin should be enlarged by forming a capacitor spacer 20 after patterning the upper metal layer 14, as shown in FIG. 2. However, in this latter case, one or more electrical characteristics of the capacitor may be changed, the additional processing may cause an increase in the process cost, and/or the increased size/area of the capacitor having spacers may result in an increase in the chip area, reducing the number of gross die per wafer.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to provide a method of forming a metal-insulator-metal (MIM) capacitor in a semiconductor device having advantages of minimizing damage to a capacitor insulation layer and not increasing an area of the capacitor.

An exemplary method of forming a metal-insulator-metal (MIM) capacitor in a semiconductor device according to an embodiment of the present invention includes forming a capacitor insulation layer on a lower metal or conductor layer (electrode) of the MIM capacitor; forming a mask pattern on the capacitor insulation layer; forming a damaged part of the capacitor insulation layer by ion implantation using the mask pattern as an implantation mask; forming a metal layer on the damaged part of the capacitor insulation layer; and reacting the damaged part of the capacitor insulation layer with the metal layer (e.g., by siliciding) so as to form an upper conductor layer (or electrode) of the MIM capacitor.

In a further embodiment, the capacitor insulation layer may comprise a nitride such as silicon nitride. At this time, it is believed that the ion implantation breaks bonds between silicon and nitrogen atoms from a top surface to a predetermined depth in the silicon nitride layer.

The metal layer may comprise a Ti layer, a Co layer, a W layer, or a Ni layer.

The upper metal layer of the MIM capacitor may comprise a metal silicide layer.

After forming the upper metal layer of the MIM capacitor, a remaining metal layer that has not reacted with the damaged layer may be removed, e.g., by a cleaning process.

As described above, according to an embodiment of the present invention, damage to the capacitor insulation layer can be reduced or prevented by an ion implantation and silicidation process, without using a reactive ion etching process for forming the upper electrode.

DETAILED DESCRIPTION OF THE EMBODIMENTS

An exemplary embodiment of the present invention will hereinafter be described in detail with reference to the accompanying drawings.

FIG. 3 to FIG. 8 are cross-sectional views showing principal stages of a semiconductor device according to an exemplary embodiment of the present invention.

Figure 1:
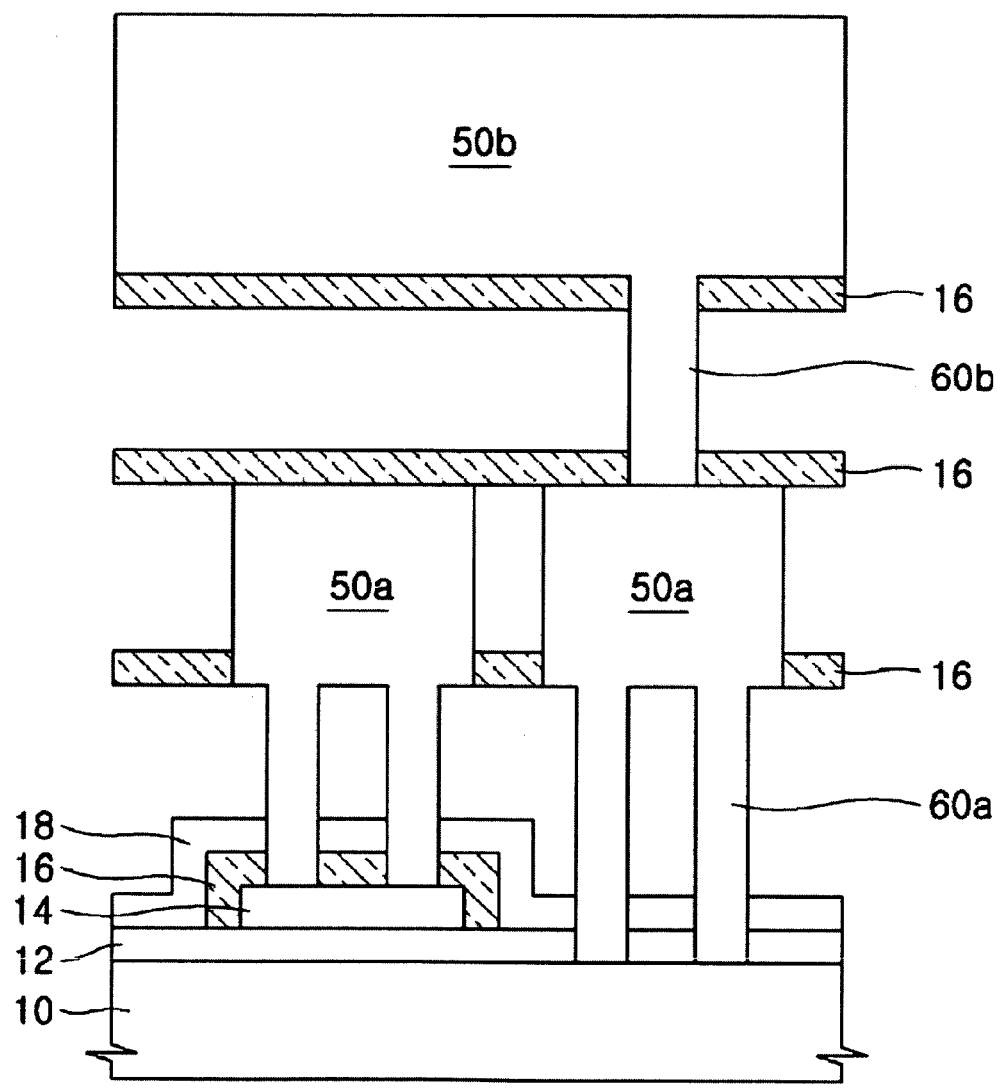
FIG. 1 is a cross-sectional view showing a semiconductor device having a general MIM capacitor.
Figure 2:
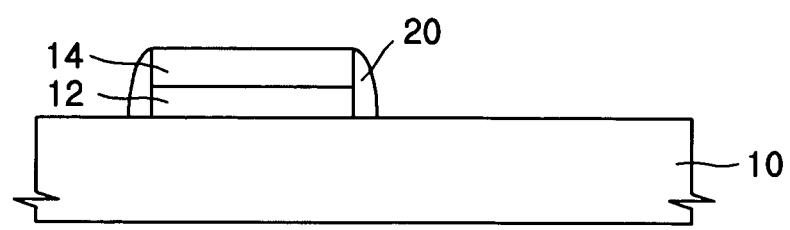
FIG. 2 is a cross-sectional view of a MIM capacitor having a capacitor spacer for preventing damage to a capacitor insulation layer.
Figure 3:
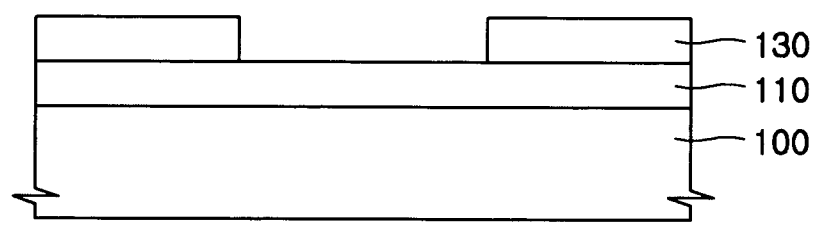
FIGS. 3 to 8 are cross-sectional views showing principal stages of manufacturing a semiconductor device according to an exemplary embodiment of the present invention.

Referring to FIG. 3, a capacitor insulation layer 110 (that may be used as a capacitor dielectric layer and as a diffusion barrier for an underlying copper layer) is formed on a lower metal layer 100. The lower metal layer 100 may comprise, for example, a copper layer. The lower metal layer 100 may also form a bottom electrode of the metal-insulator-metal (MIM) capacitor. The capacitor insulation layer 110 may comprise a nitride layer (such as silicon nitride) and may have a thickness of 500-1000 Å. Subsequently, a mask pattern 130 opening a part of the capacitor insulation layer 110 is formed thereon.

Figure 4:
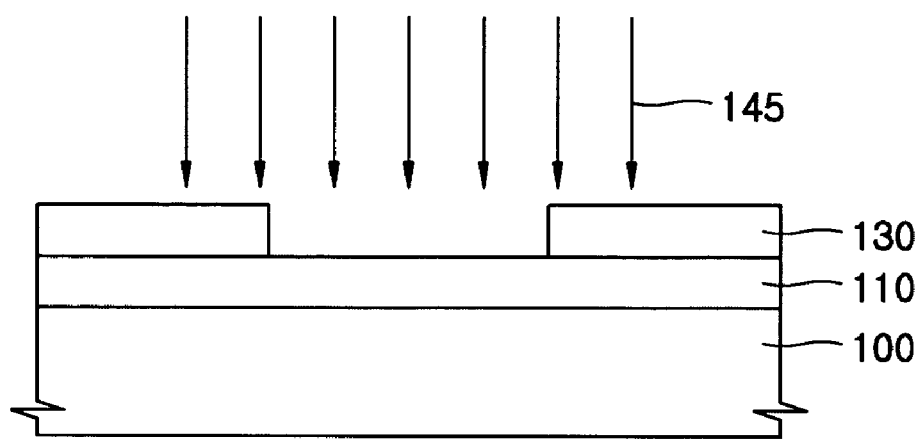
Figure 5:
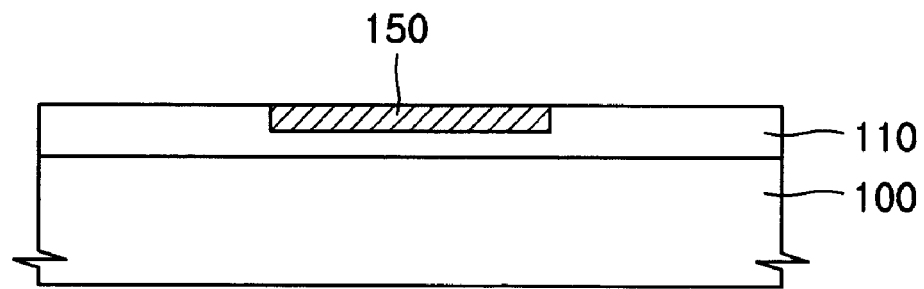

Referring to FIG. 4 and FIG. 5, an ion implantation process 145 for damaging the capacitor insulation layer 110 to a predetermined depth thereof is performed using the mask pattern 130 as an implantation mask. Consequently, a damaged layer (or part) 150 is formed in a predetermined location in the capacitor insulation layer 110. The ion implantation breaks bonds between silicon and nitrogen atoms from a top surface to a predetermined depth in the silicon nitride layer. The predetermined depth can be controlled in the ion implantation process by adequately selecting source ions (e.g., silicon, germanium, tin, or other relatively heavy ion that does not adversely affect conductivity or charge storage properties of the capacitor, such as As or In, preferably Ge) and implanting energy (e.g., for a damaged layer thickness of about 500 Å, Ge about 50 keV, and for Si, about 20 keV). The implant energy generally corresponds to (and can be correlated with) the thickness of the damaged layer. In general, for a damaged layer thickness of from about 100 to about 500 Å, the implant energy for a relatively light ion such as Si may range from 2.25 to about 22.5 keV, and the implant energy for a relatively heavy ion such as Ge may range from 4.0 to about 50 keV. A dose of ions of from 1E13 to 1E15/cm$^2$ is generally sufficient.

Figure 6:
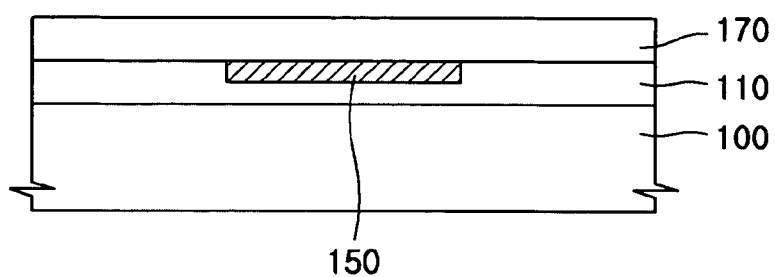

Referring to FIG. 6, a metal layer 170 is formed on the damaged layer 150 and the capacitor insulation layer 110. The metal layer 170 may comprise a Ti layer, a Co layer, or a Ni layer. Alternatively, the may comprise a W layer, or any other metal capable of forming a conductive silicide and/or nitride.

Figure 7:
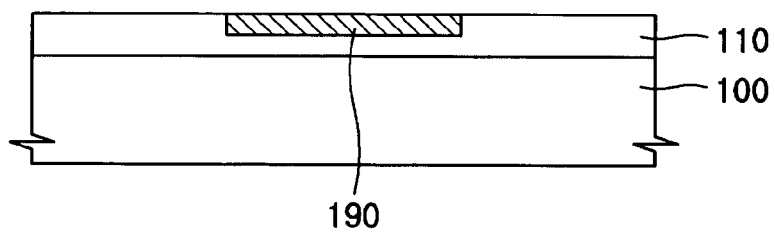

Subsequently, as shown in FIG. 7, the damaged layer of the capacitor insulation layer is reacted with the metal layer so as to form an upper metal silicide/nitride layer (or electrode) 190 of the MIM capacitor. Suitable conditions for the silicidation reaction include a temperature of from 400° C. to 700° C. for a length of time of from 20 to 90 sec, then a temperature of from 600° C. to 900° C. for a length of time of from 10 to 60 sec (when the metal layer consists essentially of Ti); a temperature of from 400° C. to 600° C. for a length of time of from 20 to 90 sec, then a temperature of from 600° C. to 950° C. for a length of time of from 10 to 60 sec (when the metal layer consists essentially of Co); and a temperature of from 350 to 450° C. for a length of time of from 30 to 150 sec (when the metal layer consists essentially of Ni). Consequently, the upper metal layer 190 is formed in a part of the capacitor insulation layer 110. Then, a remaining metal layer not having reacted with the damaged layer of the capacitor insulation layer is removed, for example by a cleaning process or a conventional selective etch, as is known in the art.

Figure 8:
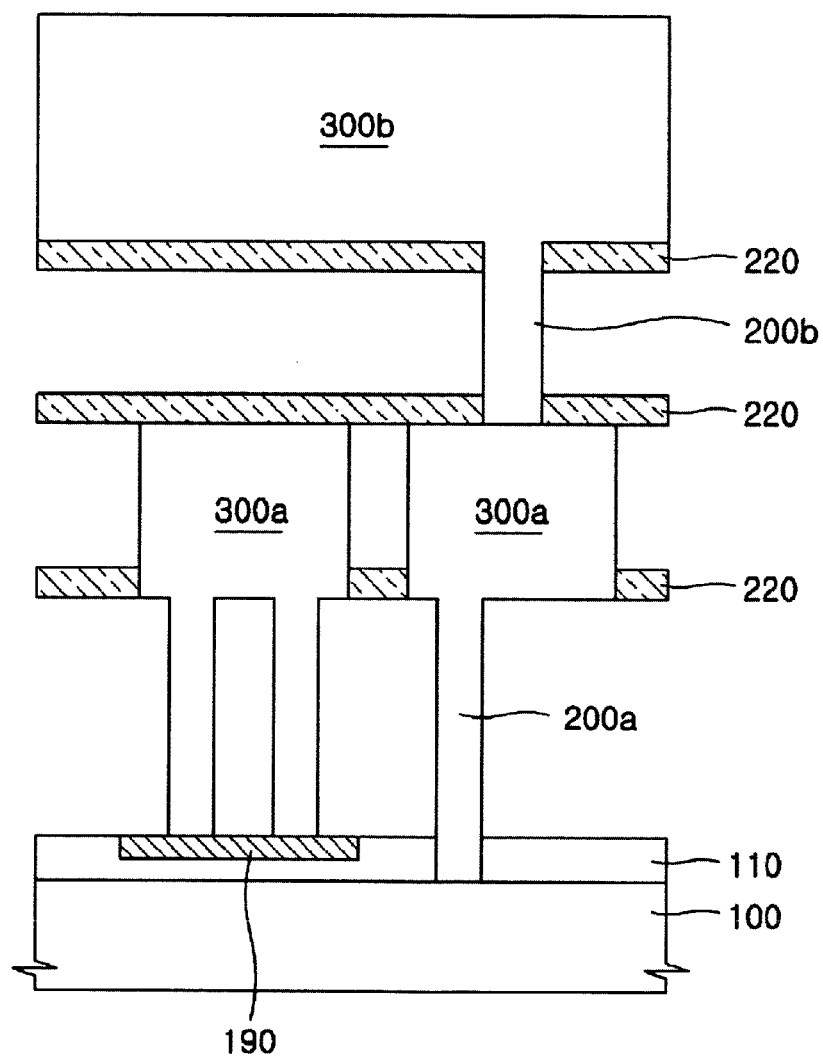

Referring to FIG. 8, after forming the upper metal layer 190 of the MIM capacitor, a typical metallization process is preformed to complete the semiconductor device. In FIG. 8, reference numerals of 300a and 300b indicate metal line layers (i.e., copper line layers), and reference numerals of 200a and 200b indicate via contacts. In addition, reference numeral 220 indicates an insulating material layer. In FIG. 8, interlayer insulator layers are omitted for convenience of description.

As described above, according to an embodiment of the present invention, the upper metal layer of the MIM capacitor is formed by an ion implantation and silicidation process without a reactive ion etching process. Consequently, damage to the capacitor insulation layer can be minimized, and therefore, an MIM capacitor having a low leakage current can be formed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal-insulator-metal (MIM) capacitor in a semiconductor device, comprising:
    forming a capacitor insulation layer on a lower conductor layer of the MIM capacitor;
    forming a mask pattern on the capacitor insulation layer;
    forming a damaged part of the capacitor insulation layer by ion implantation using the mask pattern as an implantation mask;
    forming a metal layer on the damaged part of the capacitor insulation layer; and
    reacting the damaged part of the capacitor insulation layer with the metal layer so as to form an upper electrode of the MIM capacitor.

2. The method of claim 1, wherein the capacitor insulation layer comprises a silicon nitride layer.

3. The method of claim 2, wherein the ion implantation breaks bonds between silicon and nitrogen atoms from a top surface to a predetermined depth in the silicon nitride layer.

4. The method of claim 1, wherein the metal layer comprises a Ti layer, a Co layer, a W layer, or a Ni layer.

5. The method of claim 1, wherein the upper electrode of the MIM capacitor comprises a metal suicide.

6. The method of claim 1, wherein the upper electrode layer of the MIM capacitor comprises a metal silicide and/or nitride of the formula $MSi_xN_y$.

7. The method of claim 1, wherein, after forming the upper metal layer of the MIM capacitor, the method further comprises removing a remaining unreacted metal layer.

* * * * *